United States Patent [19]

Dingwall

[11] 4,262,221

[45] Apr. 14, 1981

[54] VOLTAGE COMPARATOR

[75] Inventor: Andrew G. F. Dingwall, Bridgewater, N.J.

[73] Assignee: RCA Corporation, New York, N.Y.

[21] Appl. No.: 18,908

[22] Filed: Mar. 9, 1979

[51] Int. Cl.³ .................. H03K 5/22; H03K 5/153
[52] U.S. Cl. ............................ 307/355; 307/362; 307/313
[58] Field of Search .................. 307/362, 355, 313

[56] References Cited

U.S. PATENT DOCUMENTS

| | | |
|---|---|---|
| 3,676,702 | 7/1972 | McGrogan . |
| 3,870,966 | 3/1975 | Dingwall .................. 307/355 |
| 3,914,702 | 10/1975 | Gehweiler . |
| 4,000,412 | 12/1976 | Rosenthal .................. 307/DIG. 1 |
| 4,004,158 | 1/1977 | Morgan . |
| 4,045,747 | 8/1977 | Hsu . |
| 4,047,059 | 9/1977 | Rosenthal . |
| 4,103,190 | 7/1978 | Beutler .................. 307/362 |
| 4,160,176 | 7/1979 | Takahashi .................. 307/362 |
| 4,169,233 | 9/1979 | Haraszti .................. 307/355 |

OTHER PUBLICATIONS

"A 1 mV MOS Comparator" by Y. S. Yee et al., IEEE-JSSC, vol. SC-13 No. 3, Jun. 1978, pp. 294-297.

*Primary Examiner*—Harold A. Dixon
*Attorney, Agent, or Firm*—E. M. Whitacre; P. J. Rasmussen; E. P. Herrmann

[57] ABSTRACT

A high sensitivity voltage comparator circuit, suitable for integration in monolithic form is disclosed. First and second p-channel field effect transistors, FETs, are arranged as a first cascode amplifier between a relatively positive supply potential and an output node. First and second n-channel FETs are arranged as a second cascode amplifier similar to the first which is connected between a source of relatively negative supply potential and the same output node. Bias potentials are selectively applied to each of the gate electrodes of the FETs to balance the composite amplifier concurrently with application of a reference signal via input coupling capacitor, to the amplifier inputs. Subsequently signal potential is selectively applied to the amplifier inputs, to the exclusion of the reference potential.

8 Claims, 2 Drawing Figures

VOLTAGE COMPARATOR

This invention relates to comparator circuits and in particular to circuits compatible with integration on a silicon-on-sapphire (SOS) monolithic die.

Comparator circuits are frequently utilized to provide output signals indicative of the relative amplitude of two signal potentials, e.g., in servo loops or to indicate the relationship of a known fixed potential with a time varying potential as in analog-to-digital converters. Frequently in the latter application it is desired to include a large number of comparator circuits on a single monolithic die, e.g., 64 comparators for a 6-bit analog-to-digital converter. In such application the comparators must have relatively high sensitivity to yield the desired accuracy, yet be simple in structure so as to be integrable in monolithic form. One such comparator is shown and described in U.S. Pat. No. 3,676,702 issued July 11, 1972 to E. P. McGrogan, Jr. and entitled, "Comparator Circuit".

Circuits to be integrated in SOS technology are further required to make allowance for the floating substrates of the transistors affecting their operating characteristics. These effects can manifest themselves in a comparator circuit as a transient voltage offset shift, tending to limit the sensitivity of the circuit. The effects of the transient offsets are minimized in the present invention by performing repetitive auto zeroing through rebiasing each active device in the circuit independently.

The present invention includes first and second cascode amplifiers with a shared output node. The first cascode amplifier comprises first and second n-channel transistors having their channels connected in series between a relatively negative operating potential and the output node; and the second cascode amplifier comprises first and second p-channel transistors connected in series between a relatively positive operating potential and the output node.

The input connections of the first and second cascode amplifiers are connected via respective coupling capacitors to a common node to which a signal potential and a reference potential are selectively applied. Upon application of the reference potential, bias potential is applied to each of the active devices comprising the cascode amplifiers to electrically zero or balance the circuit.

Balancing the amplifier tends to null the effects of voltage offset shifts of individual devices by reason of the amplifier being restored to an approximately identical quiescent state each time the bias potential is selectively applied.

Figure 1:
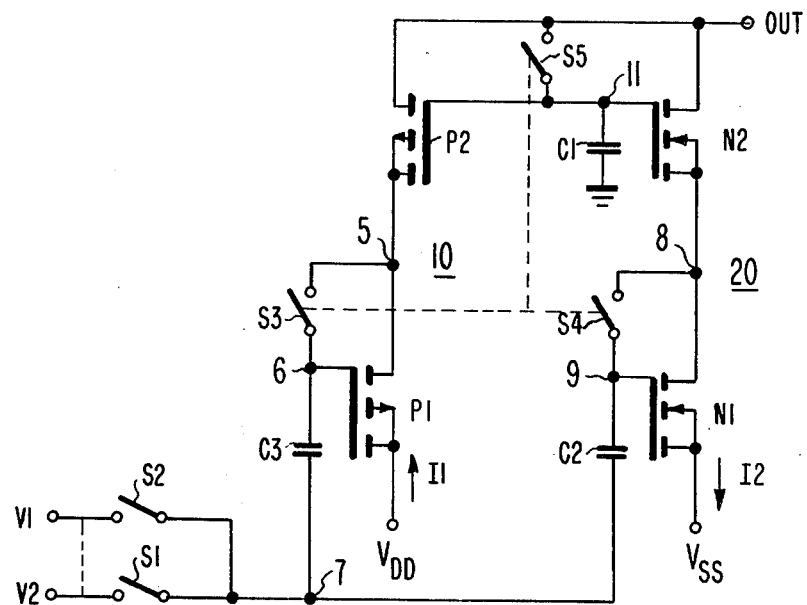
FIG. 1 is a schematic diagram of a metal-oxide-semiconductor embodiment of the invention.

In the FIG. 1 cascode amplifier 10 having signal input connection at 6 and signal output connection at OUT includes p-channel FETs P1 and P2. P1 is connected as the common-source amplifier portion of cascode 10 with its source connected to receive relatively positive supply potential $V_{DD}$, its gate electrode connected to receive signal potential at 6 and its drain connected at 5. P2 is connected as the common-gate portion of cascode 10 with its source connected at 5 for receiving signal from the drain of P1, and its drain connected for providing signal at OUT.

Similarly cascode amplifier 20, having signal input connection at 9 and signal output connection at OUT includes n-channel FETs N1 and N2. N1 having its source electrode connected for receiving relatively negative supply potential $V_{SS}$ is arranged as the common-source portion of cascode 20 while N2 having its source electrode connected to receive signal current from N1 is arranged as the common base portion of cascode 20.

Assuming that the comparator output drives the gate of a further FET, presenting essentially infinite load impedance to the terminal OUT, the load impedance driven by cascode amplifier 10 is effectively the output impedance of cascode amplifier 20. Similarly the load impedance driven by cascode amplifier 20 is the output impedance of cascode amplifier 10. Cascoding of transistors results in the amplifier having extremely high output impedance. In the cascode configuration the drain-source series impedance $r_{ds}$ of the common-source FET is multiplied by the intrinsic voltage gain, $g_m r_{ds}$, of the common-base FET. The mid band output impedance, $R_o$, of the cascode amplifiers 10 or 20 is approximately $$R_o = r_{ds2}[g_{m2}r_{ds1} = 1]$$

where the numeric subscripts refer to the transistors P1 and P2 in combination of N1 and N2 in combination, and $g_m$ is the transconductance of the FET. Common-base amplifier, P2, having unity current gain, and responsive to input signal current $I_1$ supplied to its source electrode from common-source amplifier, P1, exhibits an output voltage at OUT equal to $I_1 R_o$. The signal current $I_1$ supplied from the drain electrode of common-source amplifier P1 is equal to the signal potential $V_{in}$ applied to its input 6 multiplied by the transconductance $g_m$ of the FET or $I_1 = g_{m1}V_{in}$. The output signal available from cascode amplifier 10, employing cascode amplifier 20 as an active load is therefore $g_{m1}V_{in}R_o$ representing a voltage gain of $g_{m1} r_{ds2} [g_{m2} r_{ds1} + 1]$. Even for very small integrated devices, voltage gains in excess in 500 times have been achieved.

Amplifier 20 exhibits similar voltage gain characteristic responsive to signal applied to both the inputs 6 and 9 cause the output signals of 10 and 20 to be additive at the output terminal of the comparator.

The frequency response of the common-source amplifiers is increase by the cascode arrangement by minimizing the Miller effect between gate and drain electrodes of respective input FETs P1 and N1, as is known in the art.

Achieving the voltage gain described in the foregoing discussion is predicated on each of the transistors being biased in its high-gain current-saturation region of operation. The saturation region is defined for the transistor operating with its gate-source potential, $V_{GS}$, less than or equal to its drain-source potential, $V_{DS}$, plus a turn-on potential $V_T$, i.e., $\bot V_{GS} \bot \leq \bot V_{DS} + V_T \bot$. Referring again to FIG. 1, switches S3, S4, and S5 selectively apply the respective drain potentials of each transistor to its respective gate electrode. These potentials are stored at the gate electrodes for a period at least as the switching intervals on capacitors C3, C2 and C1. In this manner the gate-source potential criteria for the transistors to operate in current saturation, so they are conditioned for high gain operation, is assured for each transistor.

Considering the respective channels of P1, P2, N2 and N1 to be connected in series between supply potentials $V_{DD}$ and $V_{SS}$ the supply current $I_1$ and $I_2$ through the FETs are equal. Arranging P2 to electrically match N2 and P1 to electrically match N1, and for the condition S3, S4 and S5 all closed, the quiescent potential induced at OUT equals $\frac{1}{2}$ ($V_{DD}-V_{SS}$), which potential is applied to the gates of P2, N2 and stored on capacitor C1. The potential applied to the gate electrode of P1 and the gate electrode of N1 is commensurate with gate-source potential to support the drain-source current $I_1 = I_2$ passed by the series connection of transistors and is established by the choice of geometric transistor parameters for a particular design. By way of example, the potential between OUT and $V_{DD}$ will divide equally between the drain-source connections of P1 and P2 for P1 and P2 having equal channel width w to channel length 1 ratios w/1. As the w/1 ratio of P1 increases with respect to the w/1 ratio of P2 a lesser portion of the voltage between OUT and $V_{DD}$ is exhibited at node 5. The d.c. gate potentials at 6 and 9 are stored on capacitors C3 and C2 respectively.

Separate bias elements may be implemented to establish the d.c. potential on the gates of P2 and N2. In this instance a potential divider is arranged to provide a potential, e.g., $\frac{1}{2}$ ($V_{DD} -V_{SS}$) directly to the gate electrodes and obviating switch S5.

There has been shown by the circuit of FIG. 1 a high gain amplifier suitable for integration in a relatively small area of silicon due to the small number of active devices.

Two additional switches S1 and S2 are incorporated to realize the comparator function. Switches S1 and S2 selectively provide connection between a first signal voltage V1 and common node 7 and a second signal voltage V2 and node 7. For the purpose of illustration voltage V2 will be assumed to be a constant reference potential.

Switches S1-S5 are opened and closed at a rate at least as rapid as the signal frequency of V1 and V2. Switches S1, S3, S4 and S5 are opened and closed concurrently. Switch S2 is opened when switch S1 is closed and is closed when switch S1 is opened. It is preferable, at least with respect to switches S1 and S2, that the switching be break-before-make action, i.e., before S1 (S2) is closed the alternate switch S2 (S1) is opened so that node 7 is not simultaneously connected to both V1 and V2 signals.

At the beginning of each cycle, switches S1, S3, S4 and S5 are closed allowing the amplifiers 10 and 20 to establish a quiescent bias current $I_1 = I_2$ and the concomitant potentials at node OUT, 6 and 9. Simultaneously the capacitors C3 and C2 charge commensurate with the potential difference between nodes 6, 9 and V2. For V2 constant, node 7 is re-established at the V2 voltage by compensating for changes in charge on capacitors C3 and C2 due to the prior application of signal potential to node 7 via closure of S2. During the period in which switches S1, S3, S4 and S5 are closed, the circuit effectively zeroes itself irrespective of the supply potentials. Each cycle the amplifiers exhibit the same balance, or zero point, for a given set of supply potentials, and the balance or zeroing period is sufficiently long to ensure that the capacitors C2 and C3 are fully charged commensurate with the potential difference between their plates.

Switches S1, S3, S4 and S5 are subsequently opened. In the ideal situation of no leakage currents across C, S5, C3, S3, C2 or S4 the amplifier would maintain the zeroed quiescent operating potentials and current indefinitely. In lieu of such ideal conditions, the cycle time of switching is made sufficiently short, that leakages become insignificant.

Switch S2 is closed after S1 is opened, applying a step function voltage change on node 7 for voltage levels of signal V1 different from the voltage of V2. The V1 voltage is coupled via capacitors C3 and C2 to the gate electrodes of P1 and N1 respectively responsive to which amplifiers 10 and 20 exhibit a composite output signal at the comparator output terminal OUT of $2g_m r_{ds}(g_m r_{ds} + 1)$ (V1-V2) assuming P1, P2, N1 and N2 are matched devices. Switch S2 is then opened and the cycle repeated.

Note that for a gain factor of 1000 and supply potentials of $V_{DD}-V_{SS}$ equal to 5 volts a $\pm$ 5 millivolt difference in (V1-V2) is sufficient to cause an output potential excursion from $V_{DD}$ to $V_{SS}$. But, since the amplifier is zeroed to a potential mid way between $V_{DD}$ and $V_{SS}$, the difference V1-V2 need only be $-$ 2.5 millivolts to swing the output to $V_{DD}$ or $V_{SS}$. The sensitivity of the circuit is therefore doubled by the cyclic zeroing.

It is undesirable that S1 and S2 be closed simultaneously, even during switching as might occur for complementary switch controls, because this would tend to cause the circuit to zero at a transient point of some average value of V2 and V1 which is not sufficiently reproducible to guarantee good voltage resolution.

The foregoing advantages apply to bulk, or SOS integrated or discrete MOS field effect transistor circuits arranged in the described manner. In the SOS realization, the ability to zero to the same point each cycle and the use of the series connection of two cascode amplifiers between the supply potentials reduces the potential impressed across any two electrodes of a single FET. This tends to reduce transient voltage offset effects.

Figure 2:
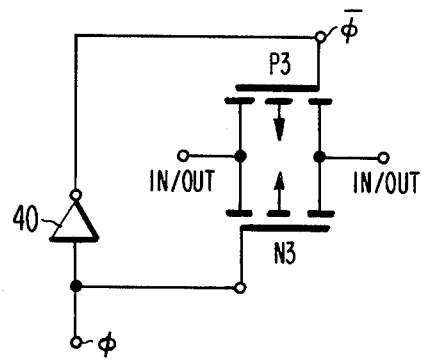
FIG. 2 is a transistor embodiment of the switches S1-S5 of FIG. 1.

Each of the switches S1-S5 may be realized by a complementary FET pair as shown in FIG. 2. The gate electrodes of the two transistors of this arrangement are driven by complementary control potentials. The complementary control potentials tend to cancel undesirable transients capacitively coupled between gate electrodes and in/out nodes of the switch. In lieu of the complementary FET pairs single field effect transistors may be employed for the switch elements to conserve device count and circuit size. In this instance it is desirable that the transistor substituted for switch S3 be of complementary type to the transistor substituted for switch S4, and the transistors substituted for switches S1 and S2 be of like type. Undesirable effects due to transients created by the control signals applied to the signal transistor switches coupling between the gates of the switch transistors and their respective drain-source circuits would tend to cancel for such an arrangement. With respect to switches S3 and S4 the control potentials tend to couple transient potentials to the high impedance gate electrodes of P1 and N1. A positive transient from a positive control pulse at S4 coupled to the gate of N1 would tend to increase the drain-source current conducted by V1; to provide this extra current and maintain the circuit balanced, a negative transient should be coupled to the gate of P1. Providing that switches S3 and S4 are complementary FETs requiring opposite or complementary control signals assures that the concomitant transients are of the proper polarity to tend to maintain the amplifier in a balanced condition. (The coupling is provided by the inherent stray capacitances of the devices.) With respect to S1 and S2, one switch, S1, turns off and the other, S2, turns on. The control potential and its transients causing S1 to turn off is compensated by the control potential and its associated transients causing S2 to turn on and vice versa.

What I claim is:

1. A comparator circuit comprising:
   first and second p-channel field effect transistors connected to form a first cascode amplifier having respective input and output terminal;
   first and second n-channel field effect transistors connected to form a second cascode amplifier having respective input and output terminals;
   a first node at which output signal is available;
   means connecting the respective output terminals of said first and second cascode amplifiers to the first node;
   means for selectively applying respective balancing potentials to the gate electrodes of the first and second p-channel and first and second n-channel transistors for causing the potential at said first node to exhibit a predetermined potential value intermediate the limits of the range of output potentials;
   first and second means for selectively applying a common signal potential to the input terminals of the first and second cascode amplifiers, respectively, which signal is applied to the exclusion of the balancing potentials.

2. A comparator circuit comprising:
   first and second terminals for applying relatively positive and relatively negative supply potentials, respectively;
   first and second field effect transistors of a first conductivity type and third and fourth field effect transistors of a second conductivity type complementary to the first, each having respective drain and source electrodes with a respective conduction path therebetween, and having a respective gate electrode;
   a third terminal for output signal;
   means serially connecting the conduction paths of the first and second transistors between the first and third terminals, said first transistor being connected nearer the first terminal;
   means serially connecting the conduction paths of the second and third transistors between the second and third terminals, said fourth transistor being connected nearer the second terminal;
   means for applying similar bias potentials to the gate electrode of the second and third transistors for conditioning them to operate in a current saturated region;
   first and second potential storage means respectively connected to the gate electrode of the first transistor and to the gate electrode of said fourth transistor for maintaining respective potentials applied to said gate electrodes;
   first and second means for selectively applying bias potential respectively to the gate electrode of the first transistor and to the gate electrode of the fourth transistor, for conditioning them to operate in a current saturation region; and
   means for selectively applying signal potential to the gate electrode of the first transistor and to the gate electrode of the fourth transistor.

3. A comparator circuit as set forth in claim 2 wherein the first and second potential storage means include:
   first and second capacitors each having first and second ends, the first ends of the first and second capacitors respectively connected to the gate electrode of the first transistor and to the gate electrode of the fourth transistor; and
   means connecting the second ends of the first and second capacitors to a common node.

4. A comparator circuit as set forth in claims 2 or 3 wherein the means for selectively applying signal potential comprises:
   first and second sources of signal potential;
   first signal switch means selectively connecting said first signal source to a node shared by respective means connecting the gate electrodes of the first and fourth transistors;
   second signal switch means selectively connecting said second signal source to said shared node, said first signal switch means being closed at times other than when said second signal switch means is closed.

5. A comparator circuit as set forth in claims 2 or 3 wherein the first and second means for selectively applying bias potential respectively to the gate electrode of the first transistor and to the gate electrode of the fourth transistor comprises:
   first and second switch means, said first switch means arranged to selectively connect the gate electrode of the first transistor to its drain electrode, said second switch means arranged to selectively connect the gate electrode of the fourth transistor to its drain electrode; and
   means for concurrently opening and closing said first and second switch means.

6. A comparator circuit as set forth in claim 5 wherein the means for selectively applying signal potential comprises:
   first and second sources of signal potential;
   first signal switch means selectively connecting said first signal source to a node shared by respective means connecting the gate electrodes of the first and fourth transistors;
   second signal switch means selectively connecting said second signal source to said shared node, said first signal switch means being closed at times other than when said second signal switch means is closed.

7. A comparator circuit as set forth in claim 6 wherein the means for applying similar bias potentials to the gate electrodes of the second and third transistors comprises a further switch means for selectively connecting an interconnection of the gate electrodes of the second and third transistors to the third terminal; and
   third potential storage means connected between the interconnection of the gate electrodes of the second and third transistors and a point of fixed potential.

8. A comparator circuit as set forth in claim 2 wherein the means for applying similar bias potentials to the gate electrodes of the second and third transistors comprises a further switch means for selectively connecting an interconnection of the gate electrodes of the second and third transistors to the third terminal; and
   third potential storage means connected between the interconnection of the gate electrodes of the second and third transistors and a point of fixed potential.

* * * * *

UNITED STATES PATENT AND TRADEMARK OFFICE
CERTIFICATE OF CORRECTION

PATENT NO. : 4,262,221     Page 1 of 2
DATED : April 14, 1981
INVENTOR(S) : Andrew G. F. Dingwall It is certified that error appears in the above—identified patent and that said Letters Patent is hereby corrected as shown below:

Column 2, Line 27 — "$R_o = r_{ds2}] g_{m2} r_{ds\ell} = 1]$" should be
-- $R_o = r_{ds2} [g_{m2} r_{ds1} + 1]$ -- ;

Column 2, Line 39 — "$I_1 - g_{m\ell} V_{in}.$" should be
-- $I_1 = g_{m1} V_{in}.$ -- ;

Column 2, Line 41 — "$g_{m\ell} V_{in} R_o$" should be -- $g_{m1} V_{in} R_o$ -- ;

Column 2, Line 42 — "$g_{m\ell} r_{ds2} [g_{gm}2 r_{ds}1 + 1]$" should be
-- $g_{m1} r_{ds2} [g_{m2} r_{ds1} + 1]$ -- ;

Column 2, Line 44 — "in 500" should be -- of 500 -- ;

Column 2, Line 46 — after "signal applied to" insert -- the gate of FET N1. Application of an input signal to -- ;

Column 2, Line 50 — "increase" should be -- increased -- ;

UNITED STATES PATENT AND TRADEMARK OFFICE
CERTIFICATE OF CORRECTION

PATENT NO. : 4,262,221

DATED : April 14, 1981

INVENTOR(S) : Andrew G. F. Dingwall

It is certified that error appears in the above—identified patent and that said Letters Patent is hereby corrected as shown below:

Column 2, Line 61 — "i.e., $\bot V_{GS} \bot \leq \bot V_{DS} + V_T \bot.$"

should be -- i.e., $|V_{GS}| \leq |V_{DS}+V_T|.$ -- ;

Column 2, Line 65 — after "as" insert -- long as -- ; and

Column 4, Line 23 — "-2.5 millivolts" should be -- ±2.5 millivolts -- .

Signed and Sealed this

Seventeenth Day of November 1981

[SEAL]

Attest:

GERALD J. MOSSINGHOFF

Attesting Officer    Commissioner of Patents and Trademarks